United States Patent
Garay et al.

(10) Patent No.: US 11,876,489 B2
(45) Date of Patent: Jan. 16, 2024

(54) DUAL DRIVE DOHERTY POWER AMPLIFIER AND SYSTEMS AND METHODS RELATING TO SAME

(71) Applicant: Falcomm, Inc., Atlanta, GA (US)

(72) Inventors: Edgar Garay, Atlanta, GA (US); Sanghoon Lee, Atlanta, GA (US)

(73) Assignee: Falcomm, Inc., Atlanta, GA (US)

( * ) Notice: Subject to any disclaimer, the term of this patent is extended or adjusted under 35 U.S.C. 154(b) by 0 days.

(21) Appl. No.: 18/184,571

(22) Filed: Mar. 15, 2023

(65) Prior Publication Data

US 2023/0299722 A1    Sep. 21, 2023

Related U.S. Application Data

(60) Provisional application No. 63/319,930, filed on Mar. 15, 2022.

(51) Int. Cl.
| | | |
|---|---|---|
| *H03F 1/07* | (2006.01) | |
| *H03F 1/02* | (2006.01) | |
| *H03F 1/56* | (2006.01) | |
| *H03F 3/21* | (2006.01) | |

(52) U.S. Cl.
CPC ........... *H03F 1/0288* (2013.01); *H03F 1/565* (2013.01); *H03F 3/211* (2013.01); *H03F 2200/387* (2013.01)

(58) Field of Classification Search
CPC ................................... H03F 1/07; H03F 1/02
USPC ............................................ 330/124 R, 295
See application file for complete search history.

(56) References Cited

U.S. PATENT DOCUMENTS

| | | | | |
|---|---|---|---|---|
| 7,619,468 | B1* | 11/2009 | Bowles | H03F 3/19 330/124 R |
| 8,981,853 | B2* | 3/2015 | Eyssa | H03F 3/45183 330/308 |
| 9,450,541 | B2* | 9/2016 | Beltran Lizarraga | H03F 3/245 |
| 11,469,726 | B2 | 10/2022 | Garay et al. | |
| 2017/0026001 | A1 | 1/2017 | Moronval et al. | |
| 2018/0332545 | A1 | 11/2018 | Sanduleanu et al. | |
| 2019/0334481 | A1 | 10/2019 | Lyalin et al. | |
| 2019/0379339 | A1 | 12/2019 | Ozard et al. | |
| 2021/0021237 | A1* | 1/2021 | Hill | H01L 23/66 |

FOREIGN PATENT DOCUMENTS

CN          113708731 A       11/2021

OTHER PUBLICATIONS

International Search Report and Written Opinion for related U.S. Patent Application PCT/US2023/064468 dated Jul. 4, 2023, 8 pages.

* cited by examiner

*Primary Examiner* — Henry Choe
(74) *Attorney, Agent, or Firm* — Pillsbury Winthrop Shaw Pittman LLP

(57) ABSTRACT

Provided is a dual-drive based Doherty amplifier that includes a first power amplifier and a second power amplifier that is in parallel with the first power amplifier. The first power amplifier is configured to receive a first portion of a signal having a first phase, and the second power amplifier is configured to receive a second portion of the signal having a second phase that has a phase difference from the first phase. At least one of the first power amplifier or the second power amplifier includes a dual-drive power amplifier core.

23 Claims, 7 Drawing Sheets

DUAL DRIVE DOHERTY POWER AMPLIFIER AND SYSTEMS AND METHODS RELATING TO SAME

CROSS-REFERENCE TO RELATED APPLICATIONS

This patent claims the benefit of U.S. Provisional Patent Application 63/319,930, filed Mar. 15, 2022, titled Dual Drive Doherty Power Amplifier and Systems and Methods Relating To Same. The entire content of each afore-listed earlier-filed application is hereby incorporated by reference for all purposes.

BACKGROUND

1. Field

The present disclosure relates generally to power amplifier architectures and, more particularly, to a combination of a Doherty load modulation power combining network with main/auxiliary power amplifier cores using a dual-drive configuration to increase the achievable communication modulation efficiency.

2. Description of the Related Art

Doherty amplifiers have been around for decades. In recent years, Doherty amplifiers have made a resurgence. For example, modern communication systems use Doherty amplifiers in massive multiple-input multiple-output (mMIMO) based base stations. The fact that modern communication systems use complex signal modulation schemes like OFDM (orthogonal frequency division multiplexing) with a high peak-to-average power ratio (PAPR), the probability of a power amplifier operating at its peak power with its maximum efficiency is very low. The property to the Doherty amplifier exhibiting multiple efficiency peaks at various lower power levels makes it an attractive option to boost the average efficiency of modern-day transmitters. The Doherty amplifier may accomplish this by using a technique called "dynamic load modulation" wherein the load is seen by the main amplifier changes as a function of power level in order to boost the efficiency at lower power levels.

SUMMARY

The following is a non-exhaustive listing of some aspects of the present techniques. These and other aspects are described in the following disclosure.

Some aspects include a dual-drive based Doherty amplifier, including: a power splitter; a first power amplifier coupled to a first output of the power splitter; and a second power amplifier that is coupled to a second output of the power splitter and that is in parallel with the first power amplifier, wherein the second power amplifier receives a second output signal from the second output with a phase difference from a phase of a first output signal from the first output, and wherein at least one of the first power amplifier or the second power amplifier includes a dual-drive power amplifier core.

Some aspects include a dual-drive based Doherty amplifier, including: a first power amplifier; and a second power amplifier that is in parallel with the first power amplifier, wherein the first power amplifier is configured to receive a first portion of a signal having a first phase, and wherein the second power amplifier receives a second portion of the signal having a second phase that has a phase difference from the first phase, and wherein at least one of the first power amplifier or the second power amplifier includes a dual-drive power amplifier core.

Some aspects include a method of amplifying power using a dual-drive based Doherty amplifier that includes a dual-drive power amplifier core.

BRIEF DESCRIPTION OF THE DRAWINGS

The above-mentioned aspects and other aspects of the present techniques will be better understood when the present application is read in view of the following figures in which like numbers indicate similar or identical elements.

Figure 1:
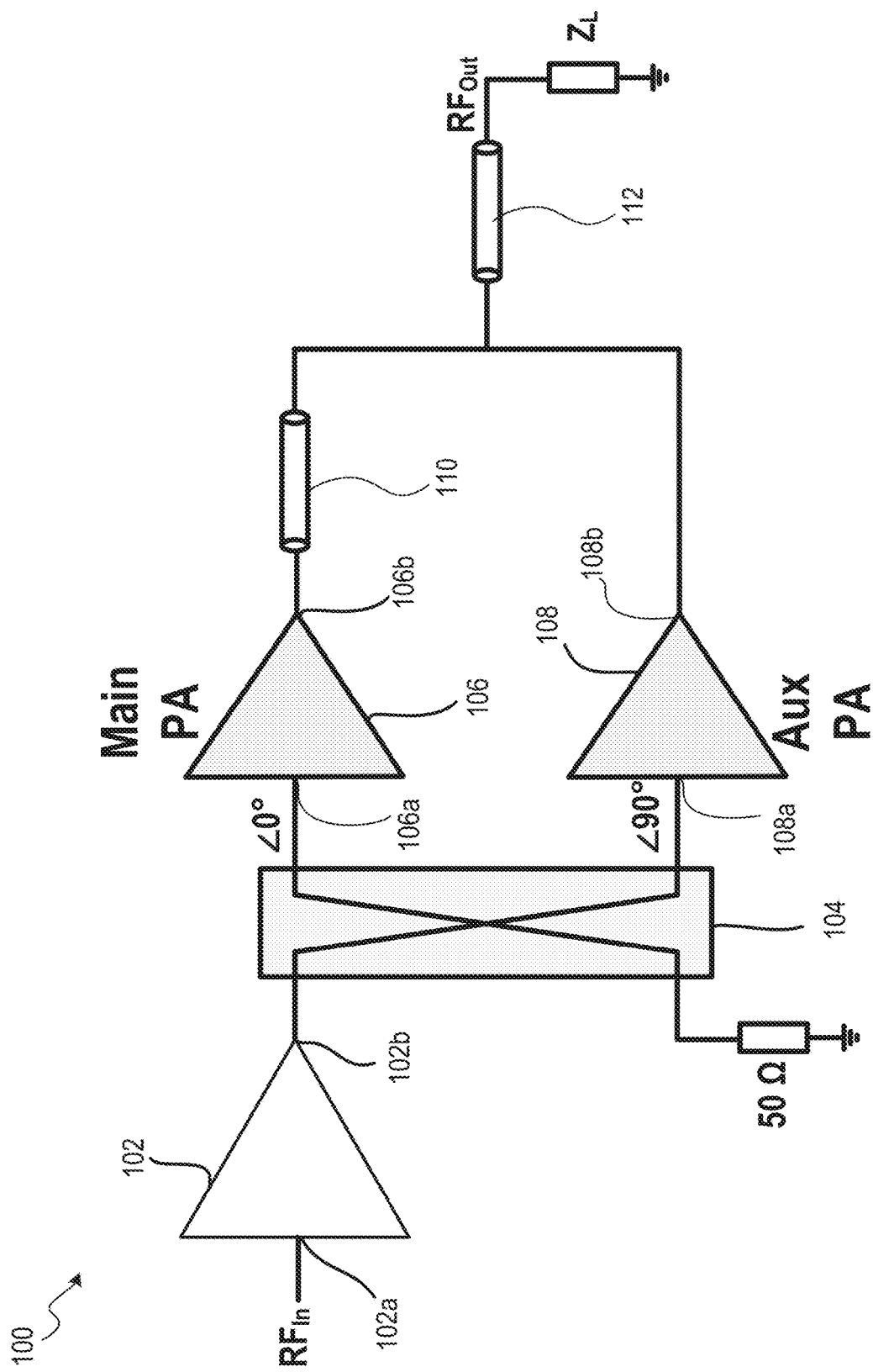
FIG. 1 illustrates a block diagram of a Doherty load modulation power combining network, in accordance with various embodiments of the present disclosure.

While the present techniques are susceptible to various modifications and alternative forms, specific embodiments thereof are shown by way of example in the drawings and will herein be described in detail. The drawings may not be to scale. It should be understood, however, that the drawings and detailed description thereto are not intended to limit the present techniques to the particular form disclosed, but to the contrary, the intention is to cover all modifications, equivalents, and alternatives falling within the spirit and scope of the present techniques as defined by the appended claims.

DETAILED DESCRIPTION OF CERTAIN EMBODIMENTS

To mitigate the problems described herein, the inventors had to both invent solutions and, in some cases just as importantly, recognize problems overlooked (or not yet foreseen) by others in the field of wireless communications, Doherty amplifiers, and power amplifiers. Indeed, the inventors wish to emphasize the difficulty of recognizing those problems that are nascent and will become much more apparent in the future should trends in industry continue as the inventors expect. Further, because multiple problems are addressed, it should be understood that some embodiments are problem-specific, and not all embodiments address every problem with traditional systems described herein or provide every benefit described herein. That said, improvements that solve various permutations of these problems are described below.

Traditional power amplifiers ("PA's") suffer from limited efficiency, output power, and gain due to low devices breakdown voltages, limited $f_{max}$, poor quality on chip passives, and limited voltage swing. In addition, while complex modulation schemes (e.g., QAMs/OFDM) are used to be spectrally efficient, they have a resultant cost in decreased peak-to-average power ratio ("PAPR"). This leads to PAs that, on average, operate away from their peak output power where they are most efficient, which in turn drastically reduces their average modulation efficiency.

To enhance the efficiency under power back-off (PBO) and hence modulation, designers have adopted complex design techniques such as load modulation (Doherty and outphasing PAs). But these techniques sacrifice gain, linearity, and peak efficiency due to their loss of the power combining/phase shifter networks. Harmonically tuned PAs enhance peak efficiency at the cost of reduced linearity and bandwidth due to the harmonic terminations. And while the dual-drive topology enhances the peak efficiency and linearity achievable by the PA core by coupling the gate and source out of phase, thus increasing the total swing, it does not enhance the efficiency under power back off conditions.

The disclosed technology relates to a new power amplifier (PA) architecture to drastically increase the achievable communication modulation efficiency. To accomplish this, the systems and methods of the present disclosure use a combination of a Doherty load modulation power combining network with main/auxiliary PA cores utilizing a dual-drive configuration as described in U.S. Pat. No. 11,469,726, filed Mar. 3, 2022, titled Highly Efficient Dual-Drive Power Amplifier For High Reliability Applications, hereby incorporated by reference for all purposes. The dual drive input coupling network supports driving the gate and source terminals of a differential pair out-of-phase while properly DC biasing both terminals. This coupling network ensures that the source and drain of the transistor swing in-phase, artificially decreasing the transistor knee voltage to increase the total output voltage swing. The enhanced voltage swing increases the PA peak output power, linearity, and efficiency. Furthermore, due to the coupling to the source, the input impedance of the dual-drive PA core is greatly reduced, minimizing the needed impedance transformation ratio, supporting broadband and low-loss matching networks.

The Doherty power-combining network supports power combining for high power applications as well as active load modulation for power back off (PBO) efficiency enhancement. The combination of the Doherty network and dual drive PA cores supports high PBO efficiency peaks for efficient communication under modulation, high gain due to lower matching losses for the input/interstage networks, and broadband operation due to the minimal impedance transformation required.

Furthermore, conventional power amplifiers (PA) suffer from limited efficiency, output power, and gain due to low devices breakdown voltages, limited $f_{max}$, poor quality on chip passives, and limited voltage swing. In addition, complex modulation schemes are used such as QAMs/OFDM to be spectrally efficient at the cost of enhanced Peak-to-average power ratio (PAPR). This leads to PAs on average operating away from their peak output power where they are most efficient, drastically reducing the average modulation efficiency. To enhance the efficiency under PBO and hence modulation, designers have adopted complex design techniques such as load modulation (Doherty and Outphasing PAs). However, these techniques sacrifice gain, linearity, and peak efficiency due to the loss of the power combining/phase shifter networks. Harmonically tuned PAs enhance peak efficiency at the cost of reduced linearity and bandwidth due to the harmonic terminations. The dual-drive topology enhances the peak efficiency and linearity achievable by the PA core by coupling the gate and source out of phase, increasing the total swing. However, it does not enhance the efficiency under power back off conditions.

To overcome these challenges, the systems and method of the present disclosure propose a new PA architecture where Doherty power combining with main/auxiliary PA cores utilizing the dual-drive configuration is employed. The Doherty PA architecture may support PBO efficiency enhancement through active load modulation. But where the Doherty PA architecture can suffer from limited peak efficiency due the limited gain and losses of the power combining/IQ power splitting network, the disclosed technology uses dual-drive PA cores for the main/auxiliary PA to mitigate these issues.

According to some embodiments of the disclosed technology, the dual drive PA cores used for the main/auxiliary PA help mitigate these issues. The dual drive active core feeds the input signal into the source and gate of the PA in an out-of-phase fashion through a multi-feed coupling network. The dual drive PA core employs a differential pair composed of M1 and M2 and a multi-feed network to couple the gate of M1 to the source of M2 and the gate of M2 to the source of M1 while ensuring the proper DC bias point: the non-zero DC voltage for the gate and DC ground for the source. The coupling network swings the source of the transistor in-phase with its drain, reducing the effective voltage knee and enhancing the output swing which in turns increases the dual drive PA core's linearity, output power, and power added efficiency compared to the conventional common source (CS) and cascode.

Therefore, according to aspects of the present disclosure, the increased peak efficiency due the dual drive PA core for the main/auxiliary may compensate for the peak efficiency reduction due to the Doherty power combining network while still maintaining PBO efficiency enhancement, vastly increasing the average efficiency achievable under modulation. Furthermore, since the dual drive topology is a combination of the common-gate and common-source amplifiers, the input impedance of the PA core is drastically reduced. This minimizes the required impedance transformation for the matching networks interfacing with the dual drive core input, extending the achievable bandwidth of the Doherty PA and minimizing the loss within the matching networks. The reduced matching network loss enhances the PA's overall gain, further enhancing the peak efficiency and hence modulation efficiency achievable by the Doherty PA. The superior performance perfectly positions the PA architecture as a highly efficient topology for commercial applications.

FIG. 1 illustrates a block diagram of a Doherty load modulation power combining network 100, in accordance with various embodiments of the present disclosure. In various embodiments, the Doherty load modulation power combining network 100 may include a Doherty power amplifier architecture. While a specific Doherty power amplifier architecture is illustrated in FIG. 1, one of skilled in the art in possession of the present disclosure will recognize that other circuits that may be classified as a Doherty power amplifier may be considered and fall under the scope of the present disclosure. The Doherty power amplifier architecture may include a driver 102 that includes a driver input 102a and a driver output 102b. The driver input 102a may receive an input signal $RF_{in}$. In various embodiments, the driver 102 may include a dual-drive power amplifier core, as discussed in further detail below.

In various embodiments The driver output 102b may provide a driver output signal to an in-phase and quadrature (IQ) network 104. The IQ network 104 may include a power splitter and a phase shifter. The power splitter may split the driver output signal to a main signal line and an auxiliary signal line. The phase shifter may be coupled to the auxiliary signal line and may shift the signal on that auxiliary signal line (e.g., the line providing the signal to the auxiliary power amplifier). While illustrated as a power splitter that splits the signal into two lines is illustrated, other splitter configurations (e.g., 3-way, 4-way, or other configurations that would be apparent to one of skill in the art) may be contemplated. In some embodiments, the phase shifter may create a quadrature (90 degree) phase shift. However, other phase shifts may be contemplated. The phases shifter may include a quadrature hybrid coupler, a Lange coupler, a polyphase filter quadrature splitter, a Schiffman phase shifter, a branchline coupler, a power split with delay line, or any other phase shifter that would be apparent to one of skill in the art in possession of the present disclosure. In various embodiments, the phase shifter outputs to an auxiliary power amplifier input 108a while a main power amplifier input 106a does not include a phase shifter and receives a portion of the driver output signal without a phase shift.

As alluded to, the IQ network 104 is coupled to a main power amplifier input 106a for a main power amplifier 106. The main power amplifier 106 may include a main power amplifier output 106b. The main power amplifier 106 may be biased in class AB. However, other classes may be contemplated. In various embodiments, the main power amplifier 106 may include a dual-drive power amplifier core, as discussed in further detail below. The IQ network 104 is also coupled to the auxiliary power amplifier input 108a for an auxiliary power amplifier 108. The auxiliary power amplifier 108 may include an auxiliary power amplifier output 108b. The auxiliary power amplifier 108 may be biased in class C. The biasing scheme means that at low input drive levels, the main power amplifier 106 conducts and the auxiliary power amplifier 108 is off. As input levels are increased, the main power amplifier 106 drive level also increases and when the output power is at about a quarter of the main power amplifier maximum, the auxiliary power amplifier 108 starts to conduct current. In various embodiments, the auxiliary power amplifier 108 may include a dual-drive power amplifier core, as discussed in further detail below.

In various embodiments, the main power amplifier output 106b may be coupled to a second phase shifter 110 (e.g., an impedance inverter) that shifts the phase of the main power amplifier output signal to match the phase of an auxiliary power amplifier output signal from the auxiliary power amplifier output 108b. As such, in various embodiments, to match the 90 degrees phase shift of the auxiliary power amplifier 108, the phase shifter 110 may include a quarter-wave impendence inverter. The signals from the phase shifter 110 and the auxiliary power amplifier output 108b may be combined at an output matching network 112 and provided as an output signal $RF_{out}$ to the load $Z_L$. While a specific Doherty load modulation power combining network 100 is illustrated in FIG. 1, one of skill in the art in possession of the present disclosure will recognize that other Doherty power amplifiers that include other components and configurations may be contemplated and still fall under the scope of the present disclosure.

Figure 2:
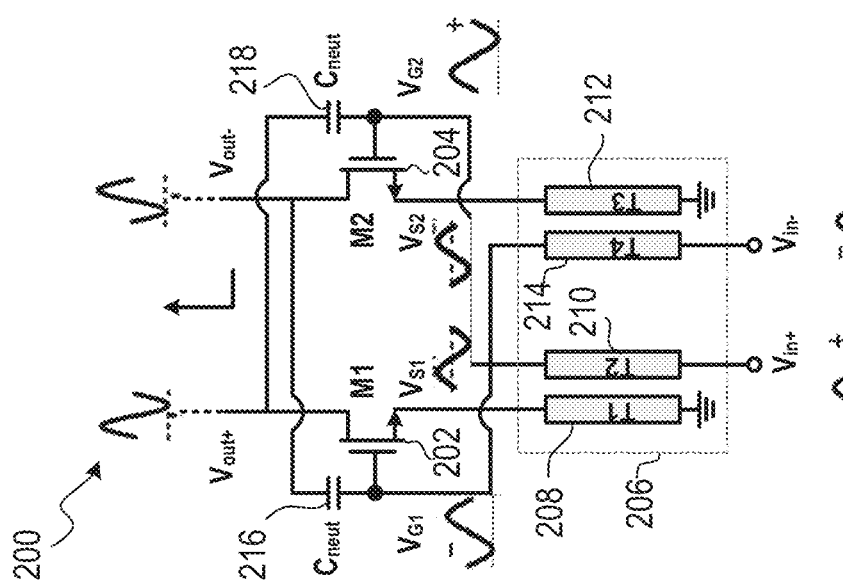
FIG. 2 illustrates a schematic diagram of a dual-drive power amplifier (PA) core, in accordance with various embodiments of the present disclosure.

FIG. 2 is a schematic diagram of a dual-drive power amplifier (PA) core 200, in accordance with an embodiment of the present disclosure, which may be provided as at least one of the main power amplifier 106 or the auxiliary power amplifier 108 of the Doherty load modulation power combining network 100 of FIG. 1. In some embodiments, the driver 102 may also include the dual-drive power amplifier core 200. The dual-drive power amplifier core 200 may utilize a transistor differential pair including a first transistor M1 202 and a second transistor M2 204 with a dual-drive coupling network 206. The dual-drive coupling network 206 may include transmission line segments T1 208, T2 210, T3 212, and T4 214, where T1 208 and T2 210 are electromagnetically coupled, and T3 212 and T4 214 are electromagnetically coupled. The dual-drive coupling network 206 may enable a first portion Vin− of balanced input signal to be applied through T4 214 to drive the gate of M1 202, while coupling a version of Vin− via T3 212 to drive the source terminal of M2 204. Simultaneously, a second portion Vin+ of the balance input signal Vin+ may be applied through T2 210 to drive the gate of M2 204, while coupling a version of Vin+ via T1 208 to drive the source terminal of M1 202. Implementations disclosed herein further allow for providing a correct DC bias point, such as non-zero DC voltage for the gates and a DC ground for the sources. Using this PA topology, the sources of the transistors 202 and 204 may swing in-phase with their drains, thus allowing the extension of the voltage knee/output swing which may linearly increase output power, and power added efficiency while using a low supply voltage.

Figure 3:
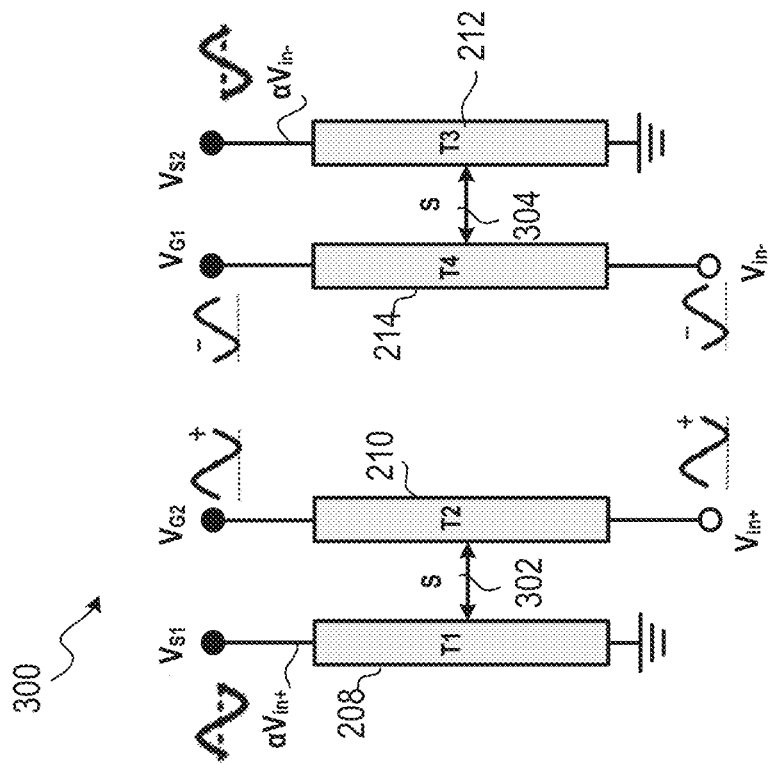
FIG. 3 illustrates coupled transmission line pairs that enable passive generation of a signals αVin+ from Vin+ and αVin− from Vin−, in accordance with various embodiments of the present disclosure.

FIG. 3 is an illustration of a coupling network 300 that may provide the dual-drive coupling network 206 of FIG. 2 that includes the pair of transmission line-based couplers T1 208 and T2 210, T3 212 and T4 214, where T1 208 is coupled (S 302) with T2 210 and T3 212 is coupled (S 304) with T4 214. While each of T1 208, T2 210, T3 212, and T4 214 (in isolation) could be considered independent transmission lines, the proximity of T1 208 to T2 210 allows electromagnetic coupling therebetween such that T1 208 and T2 210 may form a first transmission line-based coupler. Similarly, T3 212 and T4 214 may form a second transmission line-based coupler. The coupling 302 304 enables passive generation of signals αVin+ and αVin− respectively from Vin+ and Vin−. In some embodiments, the coupling network 300 may introduce inductive reactance source degeneration that may lower the overall device power gain. In certain implementations, the inductive reactance may be reduced by choosing the transmission line geometries that provide reasonably low values for the even mode impedance $Z_{0e}$ and the odd mode impedance $Z_{0o}$ while maintaining the desired coupling coefficient α. According to certain implementation of the present disclosure, the coupling coefficient α may be set by the transmission line geometries.

In some embodiments of the present disclosure, the coupling coefficient α may be set in a range between about 0.1 and about 0.9. In another embodiment, the coupling coefficient α may be set in a range between about 0.2 and about 0.8. In yet another embodiment, the coupling coefficient α may be set in a range between about 0.3 and about 0.7. In yet another embodiment, the coupling coefficient α may be set in a range between about 0.4 and about 0.6. In yet another embodiment, the coupling coefficient α may be set in a range between about 0.3 and about 0.4.

As discussed above with reference to FIGS. 2 and 3, the dual-drive power amplifier core 200 may include a first transistor M1 202 having at least three terminals comprising an M1 gate terminal, an M1 drain terminal, and an M1 source terminal. The dual-drive power amplifier core 200 may include a second transistor M2 204 having at least three terminals comprising an M2 gate terminal, an M2 drain terminal, and an M2 source terminal.

The dual-drive power amplifier core 200 may include a first transmission line coupler comprising a first transmission line section T1 208 having a first end and a second end, wherein the first end is grounded, and the second end is connected to the M1 source terminal.

The dual-drive power amplifier core 200 may include a first transmission line coupler comprising a second transmission line section T2 210 having a first end and a second end, wherein the first end may be configured to receive one or more of a core first input signal and/or a first bias voltage. The second end of the second transmission line section T2 210 may be connected to the M2 gate terminal and may be capacitively coupled to the M1 drain terminal. As discussed above, the first transmission line section T1 208 may be electromagnetically coupled with the second transmission line section T2 210.

The dual-drive power amplifier core 200 may include a second transmission line coupler comprising a third transmission line section T3 212 having a first end and a second end, wherein the first end is grounded, and the second end may be connected to the M2 source terminal.

The dual-drive power amplifier core 200 may include a fourth transmission line section T4 214 having a first end and a second end, wherein the first end may be configured to receive one or more of a core second input signal and/or the first bias voltage. The second end of the fourth transmission line section T4 214 may be connected to the M1 gate terminal and in certain implementations, may be capacitively coupled to the M2 drain terminal. As discussed above, the third transmission line section T3 212 may be electromagnetically coupled with the fourth transmission line section T4 214.

Figure 4:
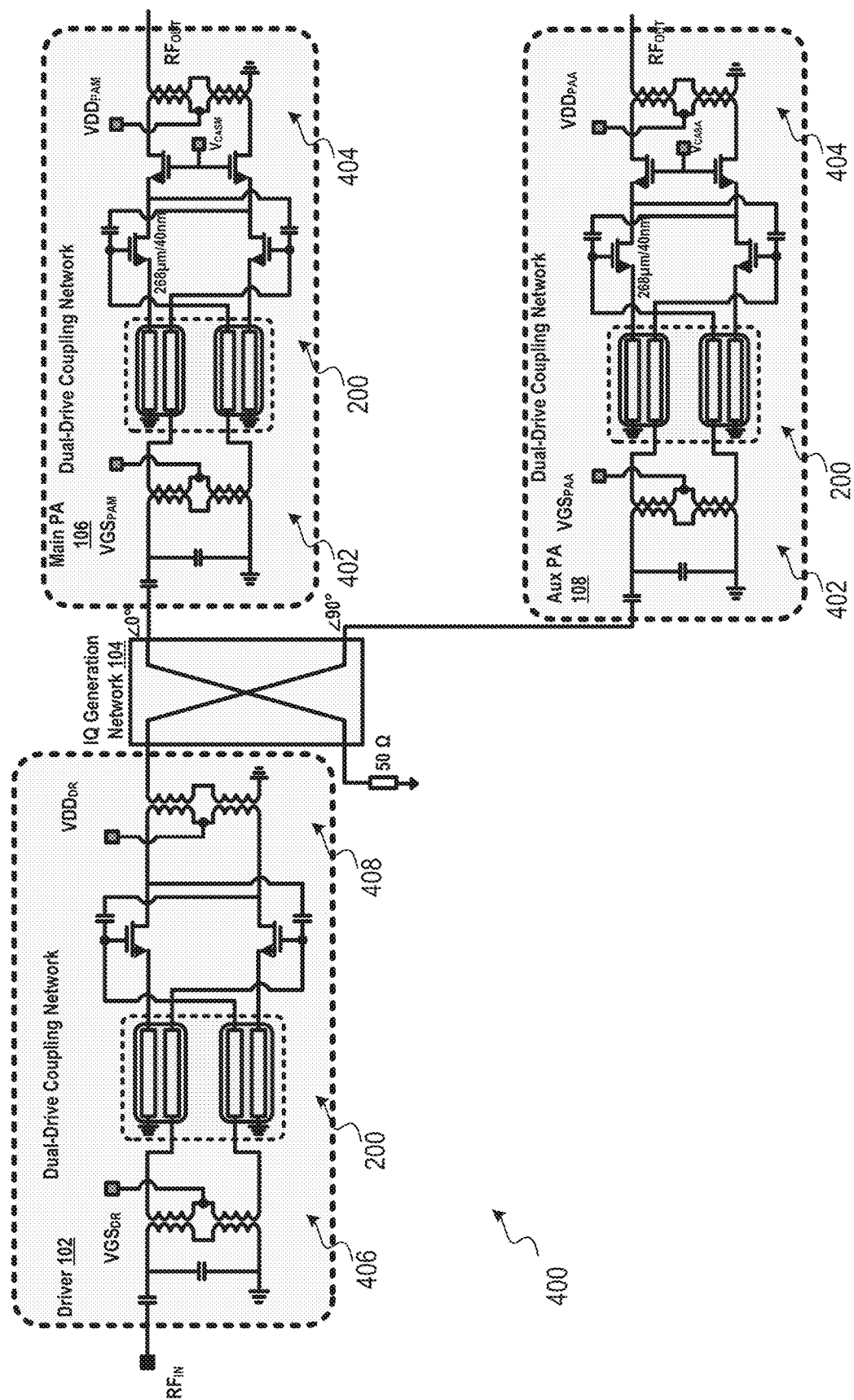
FIG. 4 illustrates a detailed schematic diagram of the Doherty load modulation power combining network of FIG. 1 that utilizes a dual-drive core of FIG. 2, in accordance with various embodiments of the present disclosure.

FIG. 4 illustrates a Doherty load modulation power combining network 400 that includes the dual-drive power amplifier core 200 of FIG. 2 used in the power amplifiers and drivers of the Doherty load modulation power combining network 100 of FIG. 1. For example, the driver 102 may include the dual-drive power amplifier core 200, the main power amplifier 106 may include the dual-drive power amplifier core 200, and the auxiliary power amplifier 108 may include the dual-drive power amplifier core 200. In the illustrated example in FIG. 4, the main power amplifier 106 and the auxiliary power amplifier 108 may include a matching network 402 and a matching network 404. The driver 102 may include a matching network 406 and a matching network 408.

Figure 5:
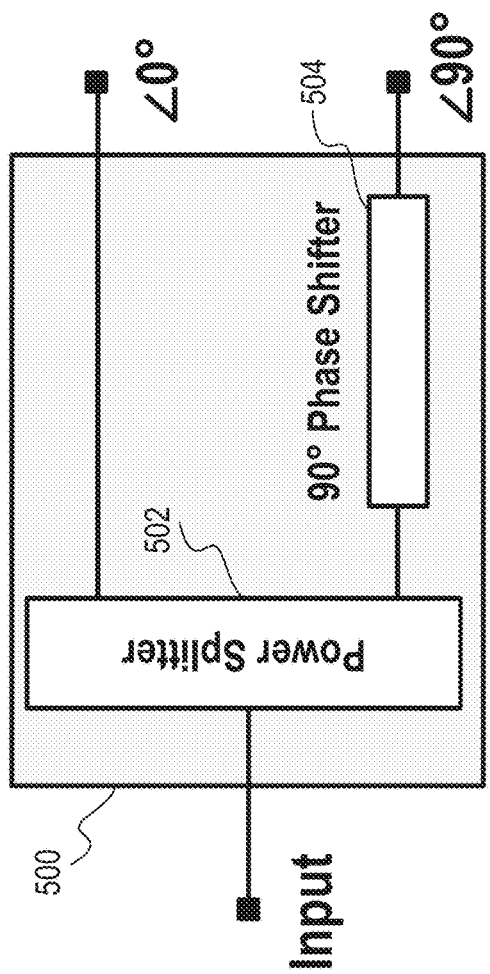
FIG. 5 illustrates a block diagram of an in-phase and quadrature (IQ) network of the Doherty load modulation power combining network of FIG. 1, in accordance with various embodiments of the present disclosure.
Figure 6:
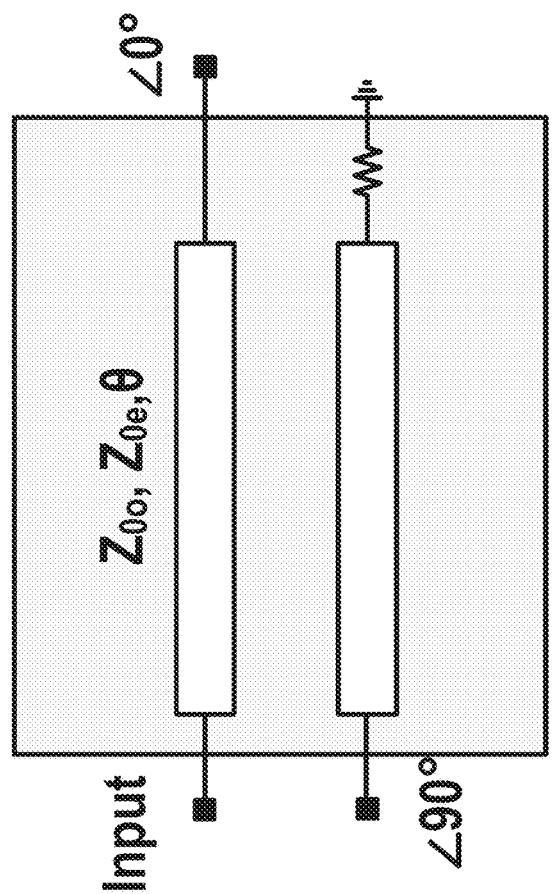
FIG. 6 illustrates a block diagram of an IQ network of the Doherty load modulation power combining network of FIG. 1, in accordance with various embodiments of the present disclosure.

FIG. 5 illustrates an IQ network 500 that may provide the IQ network 104 of FIG. 1, according to various embodiments of the present disclosure. As discussed above, the IQ network 500 may include a power splitter 502 and a phase shifter 504. The power splitter 502 may split the driver output signal or other input signal, and the phase shifter 504 may shift the signal on the line that it is coupled to (e.g., the line providing the signal to the auxiliary power amplifier 108). While illustrated as a power splitter 502 that splits the signal into two lines is illustrated, other splitter configurations (e.g., 3-way, 4-way, or other configurations that would be apparent to one of skill in the art). In some embodiments, the phase shifter 504 may create a quadrature (90 degree) phase shift. However, other phase shifts may be contemplated. The phase shifter 504 may include a quadrature hybrid coupler, a Lange coupler, a polyphase filter quadrature splitter, a Schiffman phase shifter, a branchline coupler, a power split with delay line, or any other phase shifter that would be apparent to one of skill in the art in possession of the present disclosure. In various embodiments, the phase shifter is located on an auxiliary power amplifier input 108a while a main power amplifier input 106a does not include a phase shifter. FIG. 6 illustrates an IQ network 600 as another embodiment of the the IQ network 104 of FIG. 1.

Figure 7:
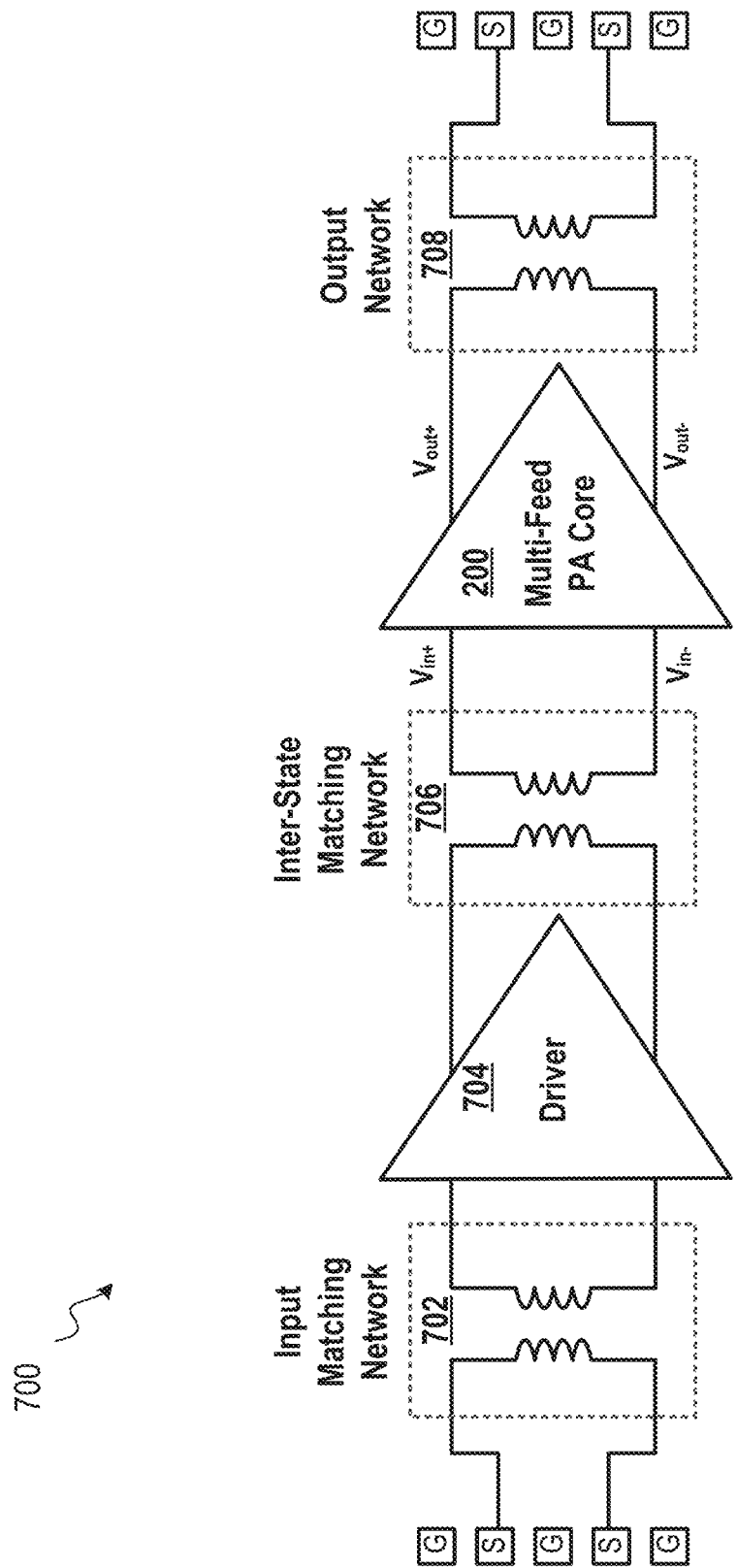
FIG. 7 illustrates an example block diagram of a power amplifier that utilizes a dual-drive core, in accordance with various embodiments of the present disclosure.

FIG. 7 is a block diagram of an example power amplifier 700 that can utilize the dual-drive power amplifier core 200 (as discussed above) in accordance with various embodiments of the present disclosure. Various arrangement may be configured to utilize the dual-drive power amplifier core 200 without departing from the scope of the present disclosure. FIG. 7 depicts one practical example of how other stages (such as an input matching network 702, a driver 704, an inter-stage matching network 706 and/or an output network 708) may be utilized with the dual-drive power amplifier core 200. The power amplifier 700 may be utilized as at least one of the main power amplifier 106 or the auxiliary power amplifier 108.

Figures 8A, 8B:
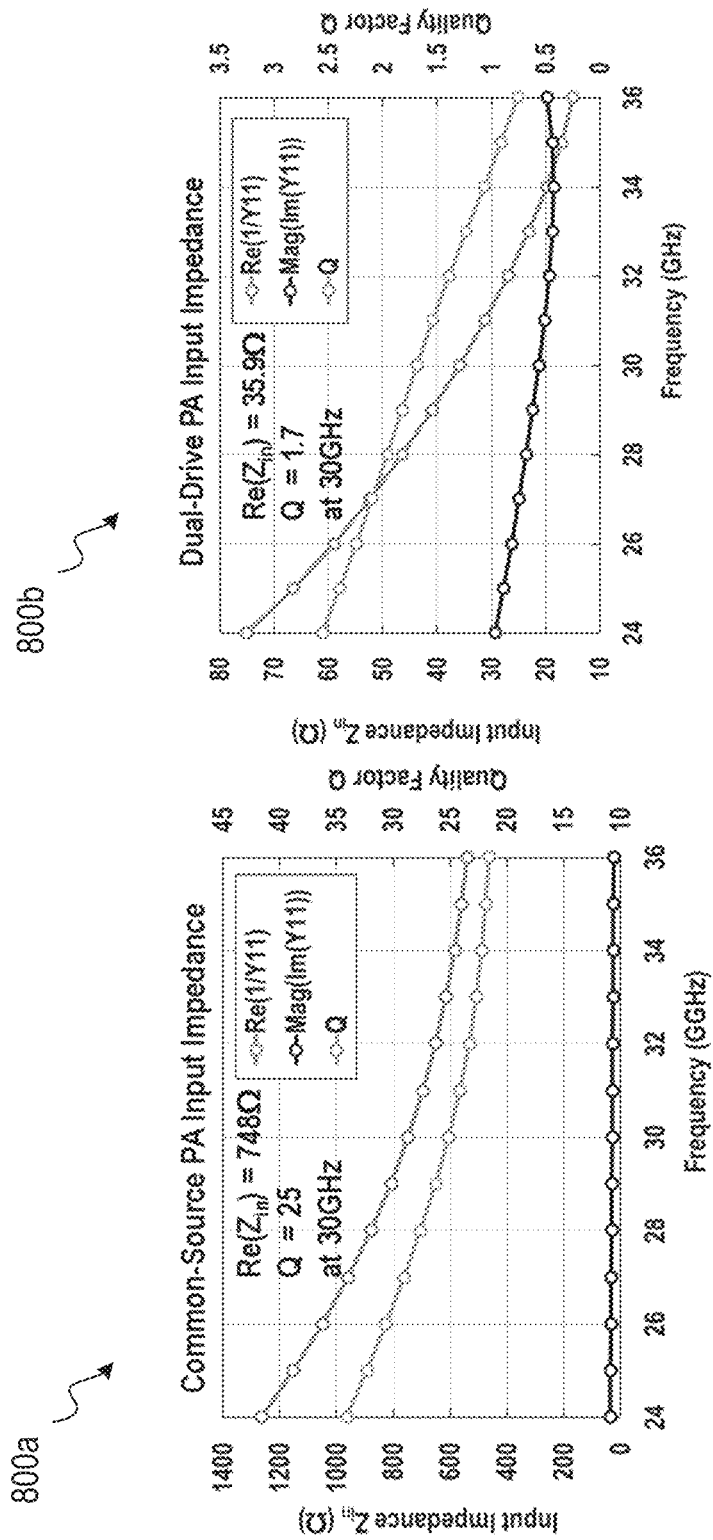
FIG. 8A illustrates a graph of input impedance of a common-source power amplifier, in accordance with various embodiments of the present disclosure.
FIG. 8B illustrates the input impedance of a dual-drive power amplifier core, in accordance with various embodiments of the present disclosure.
Figure 9:
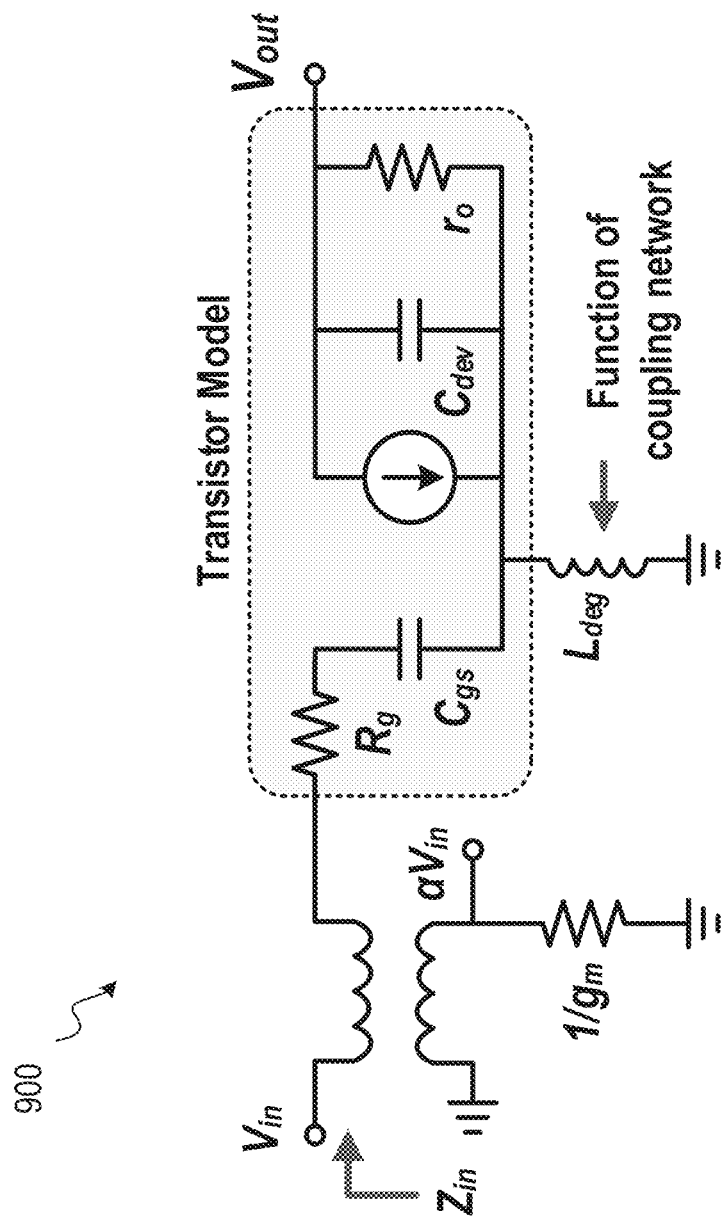
FIG. 9 illustrates a schematic diagram of small signal dual-drive transistor model that is used to derive the input impedance of the dual-drive power amplifier (PA) core of FIG. 2, in accordance with various embodiments of the present disclosure.

FIG. 8A illustrates a graph 800a of the input impedance of a common-source power amplifier and FIG. 8B illustrates a graph 800b of the input impedance of a dual-drive power amplifier core 200 of FIG. 2 with a α of 0.3. One of the benefits of a dual-drive based Doherty PA is the input impedance of the transistor is reduced since the device gate impedance is combined in parallel with its low source impedance, which also can be engineered by the source coupling, α, to ease in the design of broadband and low-loss inter-stage matching networks without the need to implement de-Qing resistors. FIG. 9 shows the small signal dual-drive transistor model 900 that is used to derive the input impedance, which includes dual-drive coupling network and inductive degeneration. The input impedance of the dual-drive power amplifier core 200 can be expressed using the following equations:

$$Z_{in} = Z_{C_{gs}} \| R_p \| \frac{1}{\alpha^2 g_m} \tag{1}$$

$$Z_{in} = \left( \frac{1}{Z_{C_{gs}}} + \frac{1}{R_p} + \alpha^2 g_m \right)^{-1} \tag{2}$$

$$Z_{in} = \left( \frac{1}{\frac{1}{j\omega C_{gs}}} + \frac{1}{R_p} + \alpha^2 g_m \right)^{-1} = \left( j\omega C_{gs} + \frac{1}{R_p} + \alpha^2 g_m \right)^{-1} \tag{3}$$

$$Z_{in} = \left( \frac{1 + \alpha^2 R_p g_m + j\omega R_p C_{gs}}{R_p} \right)^{-1} = \frac{R_p}{1 + \alpha^2 R_p g_m + j\omega R_p C_{gs}} \tag{4}$$

$$Z_{in} = \frac{R_p \times (1 + \alpha^2 R_p g_m - j\omega R_p C_{gs})}{(1 + \alpha^2 R_p g_m + j\omega R_p C_{gs}) \times (1 + \alpha^2 R_p g_m - j\omega R_p C_{gs})} \tag{5}$$

$$Z_{in} = \frac{R_p \times (1 + \alpha^2 R_p g_m) - j\omega R_p^2 C_{gs}}{(1 + \alpha^2 R_p g_m)^2 + (\omega R_p C_{gs})^2} \tag{6}$$

-continued $$Real(Z_{in}) = \frac{R_p \times (1 + \alpha^2 R_p g_m)}{(1 + \alpha^2 R_p g_m)^2 + (\omega R_p C_{gs})^2} \quad (7)$$

$$Z_{in} = R_p \| \frac{1}{\alpha^2 g_m} \quad (8)$$

$$Z_{in} = \left(\frac{1}{R_p} + \alpha^2 g_m\right)^{-1} = \left(\frac{1 + \alpha^2 R_p g_m}{R_p}\right)^{-1} = \frac{R_p}{1 + \alpha^2 R_p g_m} \quad (9)$$

$$R_{g_{deg}} = g_m X_{C_{gs}} X_{L_{deg}}(\alpha) + R_g \quad (10)$$

$$Q_{deg} = \frac{X_{C_{gs}}}{R_{g_{deg}}}; R_p = (1 + Q_{deg}^2) R_{g_{deg}}, \quad (11)$$

where $R_p$ is the parallel representation of the degenerated gate resistance due to the source inductance added by the dual-drive coupling network. The real part of the input impedance, $Z_{in}$, will be dominated by the term $$\frac{1}{\alpha^2 g_m}$$

as it is the smallest term. Furthermore, the input impedance becomes a design choice and can be easily adjusted by changing the coupling between the source and the gate.

Thus, systems and methods have been described that provide a dual drive Doherty power amplifier. Doherty power combining with main/auxiliary PA cores utilizing the dual-drive configuration is employed. The conventional Doherty PA architecture may support PBO efficiency enhancement through active load modulation. However, convention Doherty PA architecture suffers from limited peak efficiency due the limited gain and losses of the power combining/IQ power splitting network. The dual drive PA cores used for the main/auxiliary PA help mitigate these issues. The increased peak efficiency due the dual drive PA core for the main/auxiliary may compensate for the peak efficiency reduction due to the Doherty power combining network while still maintaining PBO efficiency enhancement, vastly increasing the average efficiency achievable under modulation. Furthermore, since the dual drive topology is a combination of the common-gate and common-source amplifiers, the input impedance of the PA core is drastically reduced. This minimizes the required impedance transformation for the matching networks interfacing with the dual drive core input, extending the achievable bandwidth of the Doherty PA and minimizing the loss within the matching networks. The reduced matching network loss enhances the PA's overall gain, further enhancing the peak efficiency and hence modulation efficiency achievable by the Doherty PA. The superior performance perfectly positions the PA architecture as a highly efficient topology for commercial applications such as wireless communications, radar, satellite communications, and other applications that would be apparent to one of skill in the art in possession of the present disclosure.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, notwithstanding use of the singular term "medium," the instructions may be distributed on different storage devices associated with different computing devices, for instance, with each computing device having a different subset of the instructions, an implementation consistent with usage of the singular term "medium" herein. In some cases, third party content delivery networks may host some or all of the information conveyed over networks, in which case, to the extent information (e.g., content) is said to be supplied or otherwise provided, the information may provided by sending instructions to retrieve that information from a content delivery network.

The reader should appreciate that the present application describes several independently useful techniques. Rather than separating those techniques into multiple isolated patent applications, applicants have grouped these techniques into a single document because their related subject matter lends itself to economies in the application process. But the distinct advantages and aspects of such techniques should not be conflated. In some cases, embodiments address all of the deficiencies noted herein, but it should be understood that the techniques are independently useful, and some embodiments address only a subset of such problems or offer other, unmentioned benefits that will be apparent to those of skill in the art reviewing the present disclosure. Due to costs constraints, some techniques disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such techniques or all aspects of such techniques.

It should be understood that the description and the drawings are not intended to limit the present techniques to the particular form disclosed, but to the contrary, the intention is to cover all modifications, equivalents, and alternatives falling within the spirit and scope of the present techniques as defined by the appended claims. Further modifications and alternative embodiments of various aspects of the techniques will be apparent to those skilled in the art in view of this description. Accordingly, this description and the drawings are to be construed as illustrative only and are for the purpose of teaching those skilled in the art the general manner of carrying out the present techniques. It is to be understood that the forms of the present techniques shown and described herein are to be taken as examples of embodiments. Elements and materials may be substituted for those illustrated and described herein, parts and processes may be reversed or omitted, and certain features of the present techniques may be utilized independently, all as would be apparent to one skilled in the art after having the benefit of this description of the present techniques. Changes may be made in the elements described herein without departing from the spirit and scope of the present techniques as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an element" or "a element" includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Similarly, reference to "a computer system" performing step A and "the computer system" performing step B can include the same computing device within the computer system performing both steps or different computing devices within the computer system performing steps A and B. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. Limitations as to sequence of recited steps should not be read into the claims unless explicitly specified, e.g., with explicit language like "after performing X, performing Y," in contrast to statements that might be improperly argued to imply sequence limitations, like "performing X on items, performing Y on the X'ed items," used for purposes of making claims more readable rather than specifying sequence. Statements referring to "at least Z of A, B, and C," and the like (e.g., "at least Z of A, B, or C"), refer to at least Z of the listed categories (A, B, and C) and do not require at least Z units in each category. Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device. Features described with reference to geometric constructs, like "parallel," "perpendicular/orthogonal," "square", "cylindrical," and the like, should be construed as encompassing items that substantially embody the properties of the geometric construct, e.g., reference to "parallel" surfaces encompasses substantially parallel surfaces. The permitted range of deviation from Platonic ideals of these geometric constructs is to be determined with reference to ranges in the specification, and where such ranges are not stated, with reference to industry norms in the field of use, and where such ranges are not defined, with reference to industry norms in the field of manufacturing of the designated feature, and where such ranges are not defined, features substantially embodying a geometric construct should be construed to include those features within 15% of the defining attributes of that geometric construct. The terms "first", "second", "third," "given" and so on, if used in the claims, are used to distinguish or otherwise identify, and not to show a sequential or numerical limitation. As is the case in ordinary usage in the field, data structures and formats described with reference to uses salient to a human need not be presented in a human-intelligible format to constitute the described data structure or format, e.g., text need not be rendered or even encoded in Unicode or ASCII to constitute text; images, maps, and data-visualizations need not be displayed or decoded to constitute images, maps, and data-visualizations, respectively; speech, music, and other audio need not be emitted through a speaker or decoded to constitute speech, music, or other audio, respectively. Computer implemented instructions, commands, and the like are not limited to executable code and can be implemented in the form of data that causes functionality to be invoked, e.g., in the form of arguments of a function or API call. To the extent bespoke noun phrases (and other coined terms) are used in the claims and lack a self-evident construction, the definition of such phrases may be recited in the claim itself, in which case, the use of such bespoke noun phrases should not be taken as invitation to impart additional limitations by looking to the specification or extrinsic evidence.

In this patent, to the extent any U.S. patents, U.S. patent applications, or other materials (e.g., articles) have been incorporated by reference, the text of such materials is only incorporated by reference to the extent that no conflict exists between such material and the statements and drawings set forth herein. In the event of such conflict, the text of the present document governs, and terms in this document should not be given a narrower reading in virtue of the way in which those terms are used in other materials incorporated by reference.

The present techniques will be better understood with reference to the following enumerated embodiments:

1. A dual-drive based Doherty amplifier, comprising: a power splitter; a first power amplifier coupled to a first output of the power splitter; and a second power amplifier that is coupled to a second output of the power splitter and that is in parallel with the first power amplifier, wherein the second power amplifier receives a second output signal from the second output with a phase difference from a phase of a first output signal from the first output, and wherein at least one of the first power amplifier or the second power amplifier includes a dual-drive power amplifier core.
2. The dual-drive based Doherty amplifier of embodiment 1, wherein the dual-drive power amplifier core includes: a transistor differential pair, each transistor having a gate terminal, a drain terminal, and a source terminal; and a multi-feed coupling network configured to: drive the dual-drive power amplifier core out-of-phase at the gate and source terminals by allowing the transistor differential pair to be driven out-of-phase at the gate and source terminals; and allow the source and drain terminals to swing in-phase.

3. The dual-drive based Doherty amplifier of any one of embodiments 1-2, wherein the dual-drive power amplifier core includes: a core first output terminal Vout+ configured to be connected to a drain terminal of a first transistor; a core second output terminal Vout− configured to be connected to a drain terminal of a second transistor; and transmission line couplers, a first transmission line coupler comprising a transmission line section having a first end configured to receive a core first input signal Vin+, and a second transmission line coupler comprising a transmission line section having a first end configured to receive a core first input signal Vin−, wherein the core first and second output terminals are configured to output an amplified differential signal corresponding to a difference between the core first input signal Vin+ and the core second input signal Vin−.

4. The dual-drive based Doherty amplifier of embodiment 3, wherein the dual-drive power amplifier core includes: the first transistor comprising first transistor M1 having an M1 gate terminal, the drain terminal comprising M1 drain terminal, and an M1 source terminal; and the second transistor comprising second transistor M2 having an M2 gate terminal, the drain terminal comprising M2 drain terminal, and an M2 source terminal; wherein the first transmission line coupler further comprises a first transmission line section T1 having a first end and a second end, wherein the first end is grounded, and the second end is connected to the M1 source terminal; wherein the transmission line section having the first end configured to receive the core first input signal Vin+ comprises a second transmission line section T2 of the first transmission line coupler, wherein the second transmission line section T2 further has a second end connected to the M2 gate terminal and coupled to the M1 drain terminal; wherein the first transmission line section T1 is electromagnetically coupled with the second transmission line section T2; wherein the second transmission line coupler further comprises a third transmission line section T3 having a first end and a second end, wherein the first end is grounded, and the second end is connected to the M2 source terminal; wherein the transmission line section having the first end configured to receive the core first input signal Vin− comprises a fourth transmission line section T4, wherein the fourth transmission line section T4 further has a second end connected to the M1 gate terminal and coupled to the M2 drain terminal; and wherein the third transmission line section T3 is electromagnetically coupled with the fourth transmission line section T4.

5. The dual-drive based Doherty amplifier of any one of embodiments 1-4, further comprising: a driver that includes a driver input and a driver output, wherein the driver output is coupled to an input of the power splitter.

6. The dual-drive based Doherty amplifier of embodiment 5, wherein the driver includes a dual-drive power amplifier core.

7. The dual-drive based Doherty amplifier of any one of embodiments 1-6, wherein the dual-drive power amplifier core improves broadband operation of the dual-drive based Doherty amplifier due to a reduction of input impedance at the dual-drive power amplifier core.

8. The dual-drive based Doherty amplifier of any one of embodiments 1-7, wherein the first amplifier is a class-AB amplifier and the second amplifier is a class-C amplifier.

9. The dual-drive based Doherty amplifier of any one of embodiments 1-8, further comprising an impedance inverter coupled to a power amplifier output of the first power amplifier.

10. The dual-drive based Doherty amplifier of embodiment 9, further comprising an output matching network coupled with the impedance inverter and a power amplifier output of the second power amplifier, wherein an output matching network output is provided to a load.

11. A dual-drive based Doherty amplifier, comprising: a first power amplifier; and a second power amplifier that is in parallel with the first power amplifier, wherein the first power amplifier is configured to receive a first portion of a signal having a first phase, and wherein the the second power amplifier receives a second portion of the signal having a second phase that has a phase difference from the first phase, and wherein at least one of the first power amplifier or the second power amplifier includes a dual-drive power amplifier core.

12. The dual-drive based Doherty amplifier of embodiment 11, wherein the dual-drive power amplifier core includes: a transistor differential pair, each transistor having a gate terminal, a drain terminal, and a source terminal; and a multi-feed coupling network configured to: drive the core out-of-phase at the gate and source terminals by allowing the transistor differential pair to be driven out-of-phase at the gate and source terminals; and allow the source and drain terminals to swing in-phase.

13. The dual-drive based Doherty amplifier of embodiment 12, wherein the multi-feed coupling network: couples the input signal from the gate terminal of a first transistor of the transistor differential pair to the source terminal of a second transistor of the transistor differential pair; and the gate terminal of the second transistor to the source terminal of the first transistor; while providing a non-zero DC voltage for the gate terminal and a DC ground for the source terminal.

14. The dual-drive based Doherty amplifier of any one of embodiments 11-13, further comprising: an in-phase and quadrature (IQ) network, wherein the IQ network includes a power splitter that is configured to receive an input signal and split the input signal into the first portion of the signal and the second portion of the signal.

15. The dual-drive based Doherty amplifier of any one of embodiments 11-14, further comprising: a driver that includes a driver input and a driver output, wherein the driver output is coupled to an input of the power splitter.

16. The dual-drive based Doherty amplifier of embodiment 15, wherein the driver includes a dual-drive power amplifier core.

17. The dual-drive based Doherty amplifier of any one of embodiments 11-16, wherein the dual-drive power amplifier core improves broadband operation of the dual-drive based Doherty amplifier due to a reduction of input impedance at the dual-drive power amplifier core.

18. The dual-drive based Doherty amplifier of any one of embodiments 11-17, wherein the first amplifier is a class-AB amplifier and the second amplifier is a class-C amplifier.
19. The dual-drive based Doherty amplifier of any one of embodiments 11-18, further comprising an impedance inverter coupled to a power amplifier output of the first power amplifier.
20. The dual-drive based Doherty amplifier of embodiment 19, further comprising an output matching network coupled with the impedance inverter and a power amplifier output of the second power amplifier, wherein an output matching network output is provided to a load.

What is claimed is:

1. A dual-drive based Doherty amplifier, comprising:
a power splitter;
a first power amplifier coupled to a first output of the power splitter; and
a second power amplifier that is coupled to a second output of the power splitter and that is in parallel with the first power amplifier,
wherein the second power amplifier receives a second output signal from the second output with a phase difference from a phase of a first output signal from the first output,
wherein at least one of the first power amplifier or the second power amplifier includes a dual-drive power amplifier core, and
wherein the dual-drive power amplifier core includes:
a transistor differential pair, each transistor having a gate terminal, a drain terminal, and a source terminal; and
a multi-feed coupling network configured to:
drive the dual-drive power amplifier core out-of-phase at the gate terminal and the source terminal by allowing the transistor differential pair to be driven out-of-phase at the gate terminal and the source terminal; and
allow the source terminal and the drain terminal to swing in-phase.

2. The dual-drive based Doherty amplifier of claim 1, further comprising:
a driver that includes a driver input and a driver output, wherein the driver output is coupled to an input of the power splitter.

3. The dual-drive based Doherty amplifier of claim 2, wherein the driver includes a second dual-drive power amplifier core.

4. The dual-drive based Doherty amplifier of claim 1, wherein the dual-drive power amplifier core improves broadband operation of the dual-drive based Doherty amplifier due to a reduction of input impedance at the dual-drive power amplifier core.

5. The dual-drive based Doherty amplifier of claim 1, wherein the first power amplifier is a class-AB amplifier and the second power amplifier is a class-C amplifier.

6. The dual-drive based Doherty amplifier of claim 1, further comprising an impedance inverter coupled to a power amplifier output of the first power amplifier.

7. The dual-drive based Doherty amplifier of claim 6, further comprising an output matching network coupled with the impedance inverter and a power amplifier output of the second power amplifier, wherein an output matching network output is provided to a load.

8. A dual-drive based Doherty amplifier, comprising:
a first power amplifier; and
a second power amplifier that is in parallel with the first power amplifier,
wherein the first power amplifier is configured to receive a first portion of a signal having a first phase,
wherein the second power amplifier receives a second portion of the signal having a second phase that has a phase difference from the first phase, and wherein at least one of the first power amplifier or the second power amplifier includes a dual-drive power amplifier core, and
wherein the dual-drive power amplifier core includes:
a transistor differential pair, each transistor having a gate terminal, a drain terminal, and a source terminal; and
a multi-feed coupling network configured to:
drive the dual-drive power amplifier core out-of-phase at the gate terminal and the source terminal by allowing the transistor differential pair to be driven out-of-phase at the gate terminal and the source terminal; and
allow the source terminal and the drain terminal to swing in-phase.

9. The dual-drive based Doherty amplifier of claim 8, wherein the multi-feed coupling network:
couples an input signal from the gate terminal of a first transistor of the transistor differential pair to the source terminal of a second transistor of the transistor differential pair; and
the gate terminal of the second transistor to the source terminal of the first transistor; while providing a non-zero DC voltage for the gate terminal and a DC ground for the source terminal.

10. The dual-drive based Doherty amplifier of claim 8, further comprising:
an in-phase and quadrature (IQ) network, wherein the IQ network includes a power splitter that is configured to receive an input signal and split the input signal into the first portion of the signal and the second portion of the signal.

11. The dual-drive based Doherty amplifier of claim 10, further comprising:
a driver that includes a driver input and a driver output, wherein the driver output is coupled to an input of the power splitter.

12. The dual-drive based Doherty amplifier of claim 11, wherein the driver includes a second dual-drive power amplifier core.

13. The dual-drive based Doherty amplifier of claim 8, wherein the dual-drive power amplifier core improves broadband operation of the dual-drive based Doherty amplifier due to a reduction of input impedance at the dual-drive power amplifier core.

14. The dual-drive based Doherty amplifier of claim 8, wherein the first power amplifier is a class-AB amplifier and the second power amplifier is a class-C amplifier.

15. The dual-drive based Doherty amplifier of claim 8, further comprising an impedance inverter coupled to a power amplifier output of the first power amplifier.

16. The dual-drive based Doherty amplifier of claim 15, further comprising an output matching network coupled with the impedance inverter and a power amplifier output of the second power amplifier, wherein an output matching network output is provided to a load.

17. A dual-drive based Doherty amplifier, comprising:
a power splitter;
a first power amplifier coupled to a first output of the power splitter; and a second power amplifier that is coupled to a second output of the power splitter and that is in parallel with the first power amplifier,
wherein the second power amplifier receives a second output signal from the second output with a phase difference from a phase of a first output signal from the first output,
wherein at least one of the first power amplifier or the second power amplifier includes a dual-drive power amplifier core, and
wherein the dual-drive power amplifier core includes:
a core first output terminal Vout+ configured to be connected to a drain terminal of a first transistor;
a core second output terminal Vout− configured to be connected to a drain terminal of a second transistor; and
transmission line couplers including a first transmission line coupler comprising a transmission line section having a first end configured to receive a core first input signal Vin+, and a second transmission line coupler comprising a transmission line section having a first end configured to receive a core first input signal Vin−,
wherein the core first output terminal and the core second output terminal are configured to output an amplified differential signal corresponding to a difference between the core first input signal Vin+ and the core second input signal Vin−,
wherein the first transistor comprises first transistor M1 having an M1 gate terminal, the drain terminal comprising an M1 drain terminal, and an M1 source terminal,
wherein the second transistor comprises second transistor M2 having an M2 gate terminal, the drain terminal comprising M2 drain terminal, and an M2 source terminal,
wherein the first transmission line coupler further comprises a first transmission line section T1 having a first end and a second end, wherein the first end is grounded, and the second end is connected to the M1 source terminal,
wherein the transmission line section having the first end configured to receive the core first input signal Vin+ comprises a second transmission line section T2 of the first transmission line coupler, wherein the second transmission line section T2 further has a second end connected to the M2 gate terminal and coupled to the M1 drain terminal,
wherein the first transmission line section T1 is electromagnetically coupled with the second transmission line section T2,
wherein the second transmission line coupler further comprises a third transmission line section T3 having a first end and a second end, wherein the first end is grounded, and the second end is connected to the M2 source terminal,
wherein the transmission line section having the first end configured to receive the core first input signal Vin− comprises a fourth transmission line section T4, wherein the fourth transmission line section T4 further has a second end connected to the M1 gate terminal and coupled to the M2 drain terminal, and
wherein the third transmission line section T3 is electromagnetically coupled with the fourth transmission line section T4.

18. The dual-drive based Doherty amplifier of claim 17, further comprising:
a driver that includes a driver input and a driver output, wherein the driver output is coupled to an input of the power splitter.

19. The dual-drive based Doherty amplifier of claim 18, wherein the driver includes a second dual-drive power amplifier core.

20. The dual-drive based Doherty amplifier of claim 17, wherein the dual-drive power amplifier core improves broadband operation of the dual-drive based Doherty amplifier due to a reduction of input impedance at the dual-drive power amplifier core.

21. The dual-drive based Doherty amplifier of claim 17, wherein the first power amplifier is a class-AB amplifier and the second power amplifier is a class-C amplifier.

22. The dual-drive based Doherty amplifier of claim 17, further comprising an impedance inverter coupled to a power amplifier output of the first power amplifier.

23. The dual-drive based Doherty amplifier of claim 22, further comprising an output matching network coupled with the impedance inverter and a power amplifier output of the second power amplifier, wherein an output matching network output is provided to a load.

* * * * *